(12) United States Patent
Xue et al.

(10) Patent No.: US 9,124,217 B2
(45) Date of Patent: Sep. 1, 2015

(54) POWER AMPLIFIER

(71) Applicant: City University of Hong Kong, Kowloon (HK)

(72) Inventors: Quan Xue, Kowloon (HK); Shichang Chen, Kowloon (HK)

(73) Assignee: City University of Hong Kong, Hong Kong (HK)

( * ) Notice: Subject to any disclaimer, the term of this patent is extended or adjusted under 35 U.S.C. 154(b) by 76 days.

(21) Appl. No.: 13/894,739

(22) Filed: May 15, 2013

(65) Prior Publication Data

US 2014/0340157 A1    Nov. 20, 2014

(51) Int. Cl.
*H03F 3/68* (2006.01)
*H03F 1/02* (2006.01)

(52) U.S. Cl.
CPC .................................. *H03F 1/0288* (2013.01)

(58) Field of Classification Search
CPC ................................. H03F 3/45; H03F 1/0288
USPC .............................................. 330/124 R, 295
See application file for complete search history.

(56) References Cited

U.S. PATENT DOCUMENTS

| 7,262,656 | B2 * | 8/2007 | Shiikuma | 330/124 R |
| 7,764,120 | B2 * | 7/2010 | Pengelly | 330/124 R |
| 8,274,332 | B2 * | 9/2012 | Cho et al. | 330/295 |

* cited by examiner

*Primary Examiner* — Robert Pascal
*Assistant Examiner* — Khiem Nguyen
(74) *Attorney, Agent, or Firm* — Renner Kenner Greive Bobak Taylor & Weber

(57) ABSTRACT

A power amplifier comprising a plurality of primary amplifying channels arranged to each receive an input signal from one or more signal sources for generating a primary amplified output in each of the plurality of primary amplifying channels, a secondary amplifying channel in communication with the one or more signal sources wherein the secondary amplifying channel is arranged to receive one or more signal components each associated with the input signal received by each of the plurality of primary amplifying channels to form a merged input signal for generating a secondary amplified output, and an electric junction arrangement being in electrical communication with the primary amplified output of each of the primary amplifying channels and the secondary amplified output of the secondary amplifying channel.

11 Claims, 8 Drawing Sheets

POWER AMPLIFIER

TECHNICAL FIELD

The present invention relates to a power amplifier and particularly, although not exclusively, to a triple transistor Doherty power amplifier.

BACKGROUND

The rapid advancement in modern wireless communication has put forward a much higher requirement on the reliability, the power handling capacity and the disturbance immunity of the communication systems.

Power amplifiers play a very important role in communication systems as they are widely used in microwave and communications engineering for converting a low power signal to a significantly higher power signal. In this regard, power amplifiers being able to operate in a wide range of power levels with high efficiency are particularly advantageous as the efficiency of the power amplifiers is crucially important for power saving in cellular infrastructures or extend working endurance for handsets.

Different types of power amplifiers are used depending on the applications and the amplification requirement. For example, modulated signals used in wireless communications nowadays are very complex as they are arranged to convey more information in a limited spectrum bandwidth. Consequently, these signals have very large peak-to-average power ratios (PAPRs). Power amplifiers that are able to provide power amplification and preserve the high efficiency for signals with large PAPRs are desirable for this application.

SUMMARY OF THE INVENTION

In accordance with a first aspect of the present invention, there is provided a power amplifier comprising a plurality of primary amplifying channels arranged to each receive an input signal from one or more signal sources for generating a primary amplified output in each of the plurality of primary amplifying channels; a secondary amplifying channel in communication with the one or more signal sources wherein the secondary amplifying channel is arranged to receive one or more signal components each associated with the input signal received by each of the plurality of primary amplifying channels to form a merged input signal for generating a secondary amplified output; and an electric junction arrangement being in electrical communication with the primary amplified output of each of the primary amplifying channels and the secondary amplified output of the secondary amplifying channel.

In an embodiment of the first aspect, the secondary amplifying channel further comprises a phase adjustment component having an impedance $Z_o$ arranged to adjust a phase of the merged input signal.

In an embodiment of the first aspect, signals from the signal sources are each divided by a distribution component to form the input signal in one of the plurality of primary amplifying channels and the signal component received by the secondary amplifying channel.

In an embodiment of the first aspect, each of the primary amplifying channels includes a primary amplifying component arranged to generate the primary amplified output in response to the input signal.

In an embodiment of the first aspect, the secondary amplifying channel includes a secondary amplifying component arranged to generate the secondary amplified output in response to the merged input signal.

In an embodiment of the first aspect, the primary amplifying components are carrier amplifiers.

In an embodiment of the first aspect, the secondary amplifying component is a peaking amplifier.

In an embodiment of the first aspect, only the carrier amplifiers are operative when the signals from the signal sources are of low power.

In an embodiment of the first aspect, the peaking and carrier amplifiers are operative when the signals from the signal sources are of high power.

In an embodiment of the first aspect, the plurality of primary amplifying channels each further includes a transformer component having an impedance $Z_T$ arranged to modulate a load impedance at different power levels.

In an embodiment of the first aspect, each of the carrier amplifiers are further associated with an output matching network and offset lines arranged to match the load impedance.

In an embodiment of the first aspect, the one or more signal components received by the secondary amplifying channel are merged by a signal merging component arranged to form the merged input signal.

In an embodiment of the first aspect, the signal merging component is a 180° hybrid coupler.

In an embodiment of the first aspect, the electric junction arrangement includes a junction component arranged to isolate the plurality of primary amplifying channels from each other when the signals from the signal sources are of low power such that the plurality of primary amplified outputs are each distributed to a load.

In an embodiment of the first aspect, the electric junction arrangement includes a junction component arranged to distribute the secondary amplified output into the plurality of primary amplifying channels and to combine a portion of the distributed secondary amplified output with the primary amplified output in each of the plurality of primary amplifying channels such that the plurality of combined outputs are each distributed to a load.

In an embodiment of the first aspect, the junction component has a 180° phase difference.

In an embodiment of the first aspect, the power amplifier further comprises a plurality of output transformers each having an impedance $Z_T'$ arranged to match the impedance $Z_o$.

In an embodiment of the first aspect, $Z_T$ and $Z_T'$ are related to $Z_o$ by $$Z_T = \frac{I_{P,sat}}{I_{C,sat}} \cdot Z_0 = \delta \cdot Z_0$$

and $$Z_T' = \frac{\delta}{\sqrt{1 + 0.5 \cdot \delta^2}} \cdot Z_0$$

respectively where $\delta$ is a saturation current ratio of the peaking amplifier to that of the carrier amplifier.

In an embodiment of the first aspect, the signals from the signal sources are equal in magnitude and out-of-phase.

In an embodiment of the first aspect, the one or more signal components received by the secondary amplifying channel are merged by a signal merging component arranged to provide a combined signal to form the merged input signal.

In an embodiment of the first aspect, the signal merging component is a T-junction combiner.

In an embodiment of the first aspect, the electric junction arrangement includes a junction node arranged to receive all the primary amplified outputs and the secondary amplified output to form a combined output such that the combined output is distributed to a load.

In an embodiment of the first aspect, the power amplifier further comprises an output transformer having an impedance $Z_T'$ arranged to adjust the combined output distributed to the load and match the impedance $Z_o$.

In an embodiment of the first aspect, $Z_T$ and $Z_T'$ are related to $Z_o$ by $$Z_T' = \frac{\delta}{\sqrt{2+\delta^2}} \cdot Z_0$$

and $$Z_T = \delta \cdot Z_0$$

respectively where $\delta$ is a saturation current ratio of the peaking amplifier to that of the carrier amplifier.

In an embodiment of the first aspect, the signals from the signal source are equal in magnitude and in-phase.

In an embodiment of the first aspect, the primary amplifying channels further comprise phase adjustment components arranged to adjust a phase of the input signals from the one or more signal sources.

In an embodiment of the first aspect, the primary amplifying components are peaking amplifiers.

In an embodiment of the first aspect, the secondary amplifying component is a carrier amplifier.

In an embodiment of the first aspect, the peaking amplifier is associated with an output matching network and offset line for impedance matching and reverse power leakage prevention.

In an embodiment of the first aspect, the signals from the signal sources are differential.

In an embodiment of the first aspect, $Z_o$ is a reference impedance of the power amplifier.

In accordance with a second aspect of the present invention, there is provided a differential Doherty amplifier having three transistors arranged to provide a plurality of amplifying power outputs, wherein the three transistors comprise at least one carrier amplifier and at least one peaking amplifier.

In accordance with a third aspect of the present invention, there is provided a power combining Doherty amplifier having three transistors arranged to provide an amplifying output, wherein the three transistors comprise at least one carrier amplifier and at least one peaking amplifier.

In an embodiment of the third aspect, the three transistors are arranged to provide the amplifying output under in-phase excitation.

In accordance with a fourth aspect of the present invention, there is provided a Doherty amplifier comprising a triple transistor arrangement arranged to provide a combined amplifying output or a plurality of differentiated amplifying outputs.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENT

Figure 1:
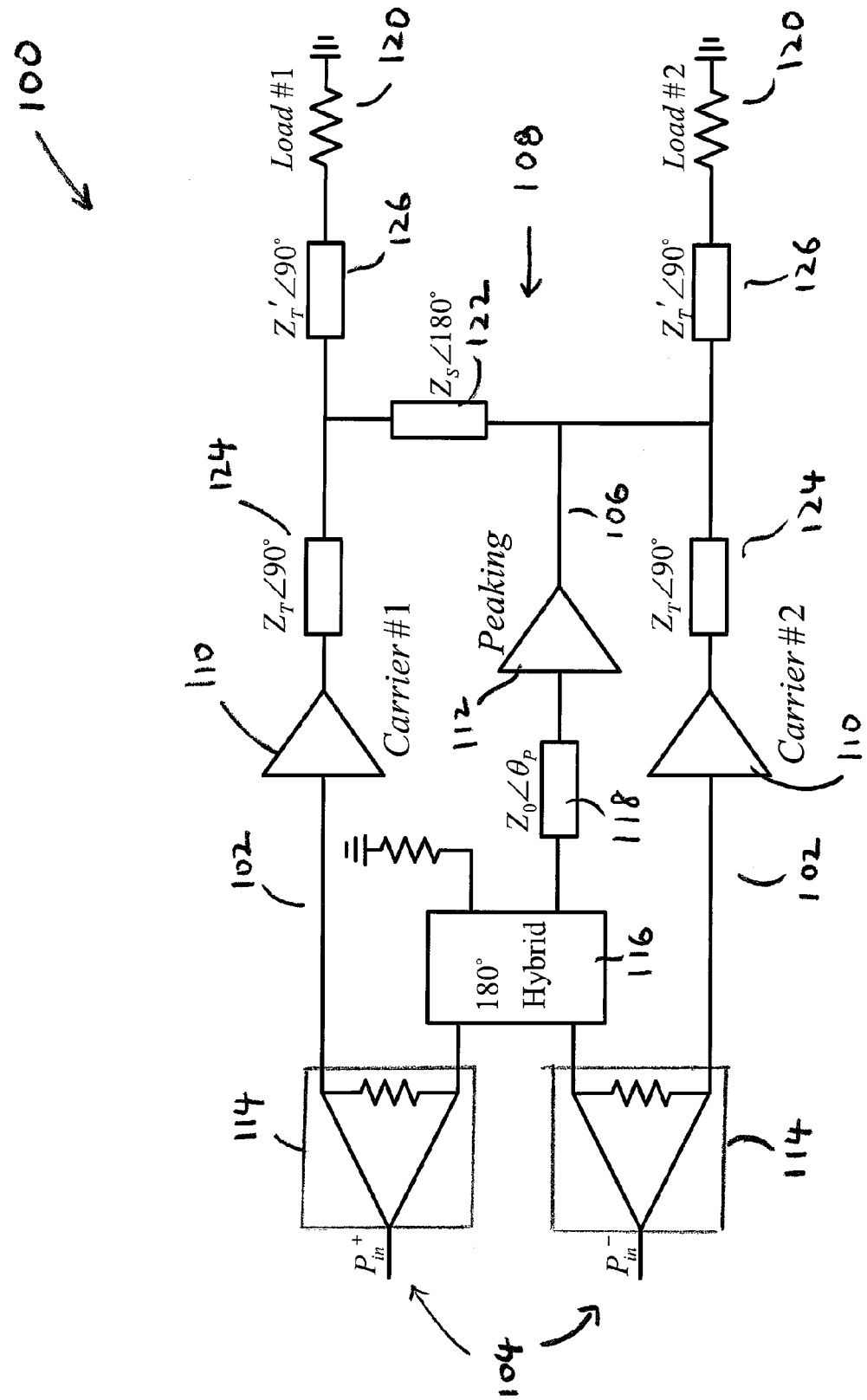
FIG. 1 shows a power amplifier with one embodiment of the present invention.

Referring to FIG. 1, there is illustrated an embodiment of a power amplifier 100 comprising a plurality of primary amplifying channels 102 arranged to each receive an input signal from one or more signal sources 104 for generating a primary amplified output in each of the plurality of primary amplifying channels 102; a secondary amplifying channel 106 in communication with the one or more signal sources 104 wherein the secondary amplifying channel 106 is arranged to receive one or more signal components each associated with the input signal received by each of the plurality of primary amplifying channels 102 to form a merged input signal for generating a secondary amplified output, and an electric junction arrangement 108 being in electrical communication with the primary amplified output of each of the primary amplifying channels 102 and the secondary amplified output of the secondary amplifying channel 106.

In this embodiment, a triple transistor arrangement supporting differential input and output is provided. Particularly, the triple transistor arrangement comprises two carrier power amplifiers 110 and a peaking power amplifier 112 arranged in parallel branches. In a preferred embodiment, these amplifiers are optimized independently before assembly. As shown in FIG. 1, the power amplifier 100 has two inputs 104 arranged to receive differential input power. The differential input power is distributed into three channels by two Wilkinson dividers 114 and a 180° hybrid coupler 116. In other embodiments, different types of signal dividing and merging components may be used. In this example, the signals delivered to the two carrier power amplifiers 110 are differential, i.e. out-of-phase but equal in magnitude and the signal delivered to the peaking power amplifier 112 is twice the magnitude of the signal delivered to any one of the carrier power amplifiers 110. A section of transmission line 118 with impedance $Z_0$ is inserted before the peaking power amplifier 112 so as to balance the phase of the signal delivered to the peaking power amplifier 112. In other embodiments, different phase balancing means may be used. In yet some other embodiments, transmission lines or other phase adjustment means may be placed before the carrier power amplifiers 110 so as to control the phase of the signal delivered to the carrier power amplifiers 110. In this embodiment, $Z_o$ is also a reference impedance of the power amplifier 100.

In this embodiment, when the input power is low, the carrier power amplifiers 110 are used for power amplification whereas the peaking power amplifier 112 remains inactive. When the input is at high power, all three amplifiers operated together to provide output power signals. Particularly, when the input power is high, output power signal from the peaking power amplifier 112 is equally distributed to the primary amplifying channels to merge with the output power signals from the two carrier power amplifiers 110. Thus, for low input power, the output power signals from the carrier power amplifiers 110 are each distributed to a load 120. For high input power, the merged output power signals are each distributed to a load 120. Preferably, the loads 120 are differential loads.

Preferably, to regulate the output distributed to the loads 120 in different power regimes, a 180° transmission line 122 is connected across the peaking power amplifier 112 and one of the carrier power amplifier 110 to regulate the power distribution for different input power. A detailed description of the operation of this transmission line will be provided below. In some other embodiments, other components having a phase difference of 180° may be used for the regulation purpose. Also, an impedance transformer 124 with impedance $Z_T$ is preferably disposed at the output of each of the carrier power amplifier 110 so as to modulate load impedance at different power levels of the carrier power amplifiers 110 prior to outputting to the loads 120 or combining with the output power signal from the peaking power amplifier 112. In the embodiment shown in FIG. 1, the impedance transformers 124 are quarter-wavelength transmission lines. In this embodiment, each of the output power signals distributed to the loads 120 are further adjusted by quarter-wavelength transmission lines 126 with impedance $Z_T'$.

Figure 2A:
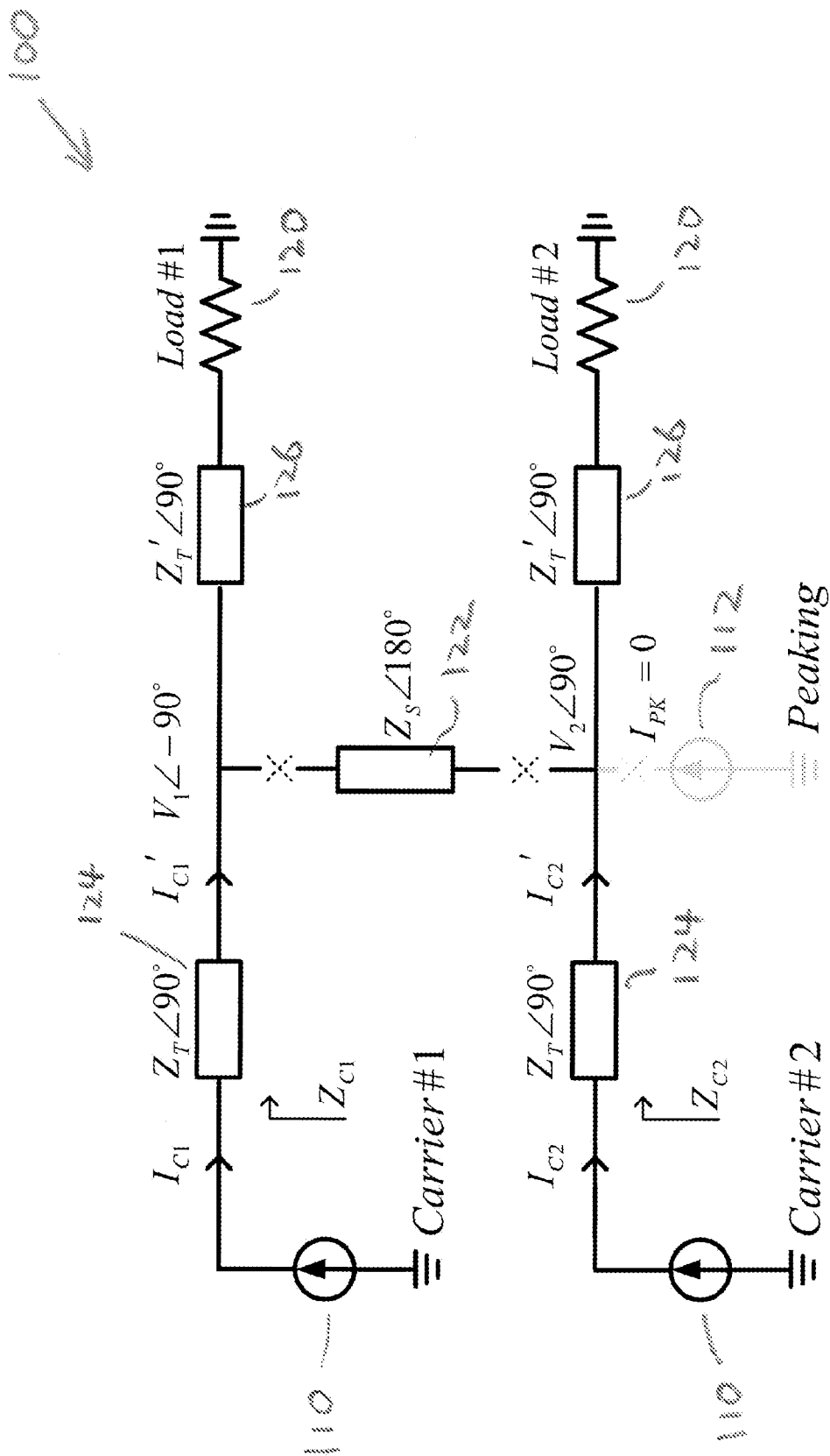
FIG. 2A shows an equivalent circuit of the power amplifier of FIG. 1 operating in a low-power region (low input power)
Figure 2B:
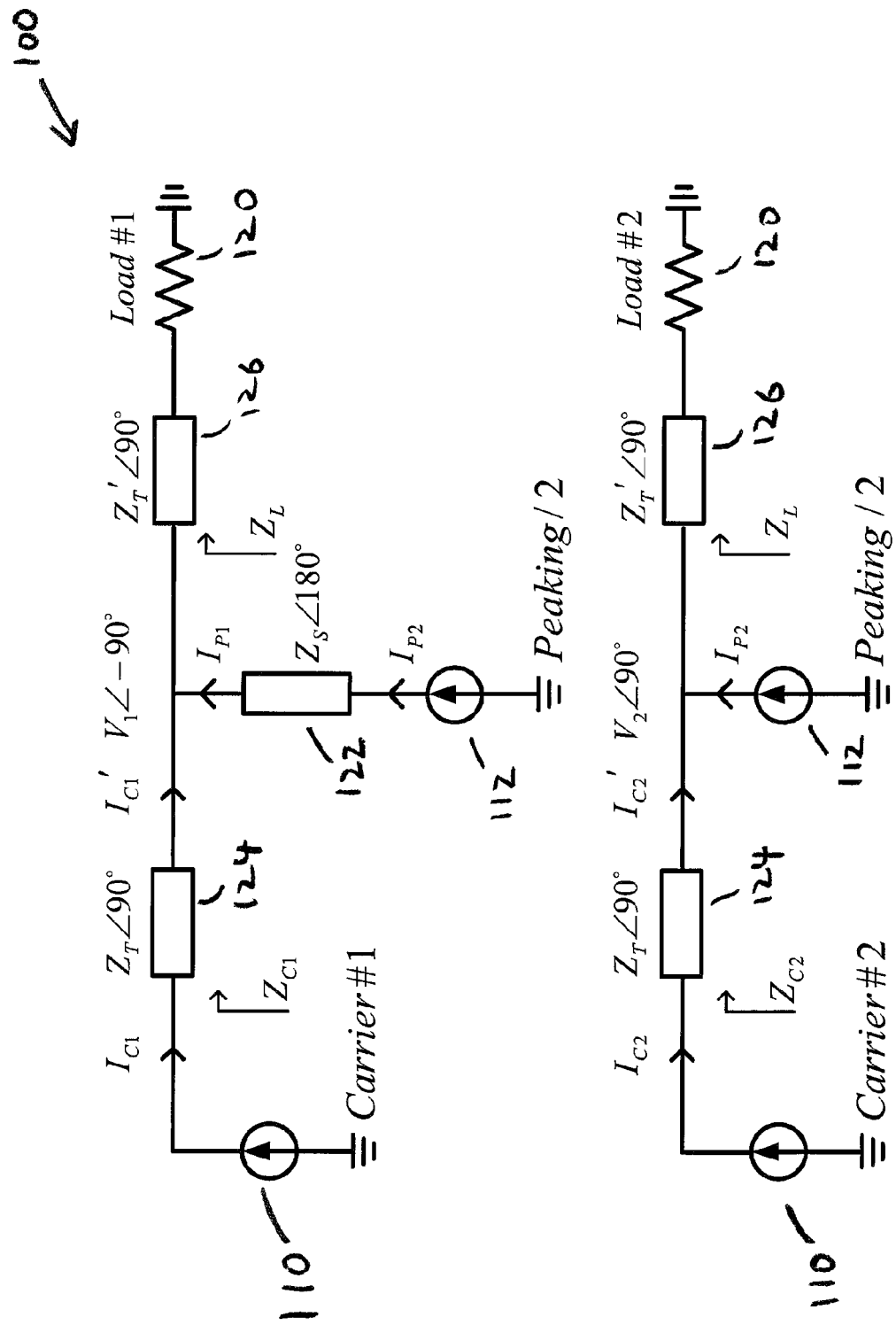
FIG. 2B shows an equivalent circuit of the power amplifier of FIG. 1 operating in a high-power region (high input power)

Referring now to FIGS. 2A and 2B, there is shown an equivalent circuit of the power amplifier 100 of FIG. 1 operating in a low-power region (low input power) and the high-power region (high input power) respectively. As shown in FIG. 2A, in the lower power region, the peaking power amplifier 112 is in an off-state. In this lower power region, the half wavelength (180°) transmission line 122 disposed between the carrier power amplifiers 110 are arranged to completely isolate the carrier power amplifiers 110 from each other by differential input excitation. As the input power increases, the peaking power amplifier 112 starts to operate.

Referring now to FIG. 2B. Suppose that every transistor (peaking and carrier) can be considered as an ideal current source, and let $$I_{C1} = I_C \angle 0°$$

$$I_{C2} = I_C \angle 180° \quad (1)$$

where $I_{C1}$, $I_{C2}$ are currents from the two carrier power amplifiers 110 respectively. By taking the phase delays of the transmission lines 124 into consideration, $$I_{C1}' = I_C' \angle -90°$$

$$I_{C2}' = I_C' \angle 90° \quad (2)$$

as the impedance seen at one end of a half wavelength line 122 (180° transmission line) is identical to the impedance seen at the other end. Consequently, the peaking power amplifier 112 shares its current equally with the two carrier power amplifiers 110. In other words, each carrier power amplifier 110 performs Doherty amplification along with half of the peaking power amplifier 112 periphery. As a result, $$I_{P2} = 1/2 \cdot I_{PK} = 1/2 \cdot I_P \angle 90°$$

$$I_{P1} = 1/2 \cdot I_{PK} \angle 180° = 1/2 \cdot I_P \angle -90° \quad (3)$$

where $I_{PK}$ is the current supplied by the peaking power amplifier 112.

Accordingly, the load impedances of the carrier power amplifiers 110 and the peaking power amplifier 112 at saturation can be expressed as $$Z_{C1,sat} = Z_{C2,sat} = \frac{Z_T^2}{Z_L}\left(1 - 0.5 \cdot \frac{I_{P,sat}}{I_{C,sat}} \cdot \frac{Z_L}{Z_T}\right) \quad (1)$$

$$Z_{P,sat} = \frac{I_{C,sat}}{I_{P,sat}} \cdot Z_T \quad (2)$$

By defining $\delta = I_{P,sat}/I_{C,sat}$ as the fundamental current ratio at saturation and let $Z_{C1,sat} = Z_{C2,sat} = Z_{P,sat} = Z_o$ in order to facilitate independent optimization of each sub-amplifier (carrier and peaking) and further assembly, the characteristic impedances of $Z_T$ and $Z_T'$ can be expressed as $$Z_T = \frac{I_{P,sat}}{I_{C,sat}} \cdot Z_0 = \delta \cdot Z_0 \quad (3)$$

$$Z_T' = \frac{\delta}{\sqrt{1 + 0.5 \cdot \delta^2}} \cdot Z_0 \quad (4)$$

based on S. Chen and Q. Xue, "Optimized Load Modulation Network for Doherty Power Amplifier Performance Enhancement," IEEE Trans. Microw. Theory Tech., vol. 60, no. 11, pp. 3474-3481, November 2012.

The load impedance for the carrier power amplifiers 110 in the low-power region can be expressed as $$Z_{C1,low} = Z_{C2,low} = (2 + \delta^2) \cdot Z_0 \quad (8)$$

In sum, in the power amplifier 100 of this preferred embodiment, the load impedance of the carrier power amplifiers 110 is modulated from $(2+\delta^2) \cdot Z_0/2$ to $Z_0$, and from $\infty$ to $Z_0$ for the peaking amplifier 112 with increasing input power.

Preferably, output matching networks and offset lines (not shown) are provided and are associated with the carrier power amplifiers 110 such that the two transistors are optimally matched to a load impedance of $(2+\delta^2) \cdot Z_0/2$ for operation in the low-power region. Preferably, the peaking amplifier also has an output matching network and an associated offset line (not shown) for impedance matching and reverse power leakage prevention.

To better characterize the performance of the power amplifier 100 in this embodiment, some parameters are expressed as follows:

$$P_{out} = P_{out1} + P_{out2} \quad (9)$$

$$\eta_t = \frac{P_{out1} + P_{out2}}{P_{dc}^{c1} + P_{dc}^{c2} + P_{dc}^{p}}$$

$$Gain_t = (P_{out1} + P_{out2}) - 2P_{in}$$

where $P_{out}$, $\eta_t$ and $Gain_t$ are the total output power, total drain efficiency and total gain and $P_{out1}$, $P_{out2}$, $P_{dc}^{c1}$, $P_{dc}^{c2}$ and $P_{dc}^{p}$ refer to the output power at the two loads 120 and the DC consumptions for the carrier power amplifiers 110 and the peaking power amplifier 112. $P_{in}$ refers to half of the differential input power as shown in FIG. 1.

Figure 3:
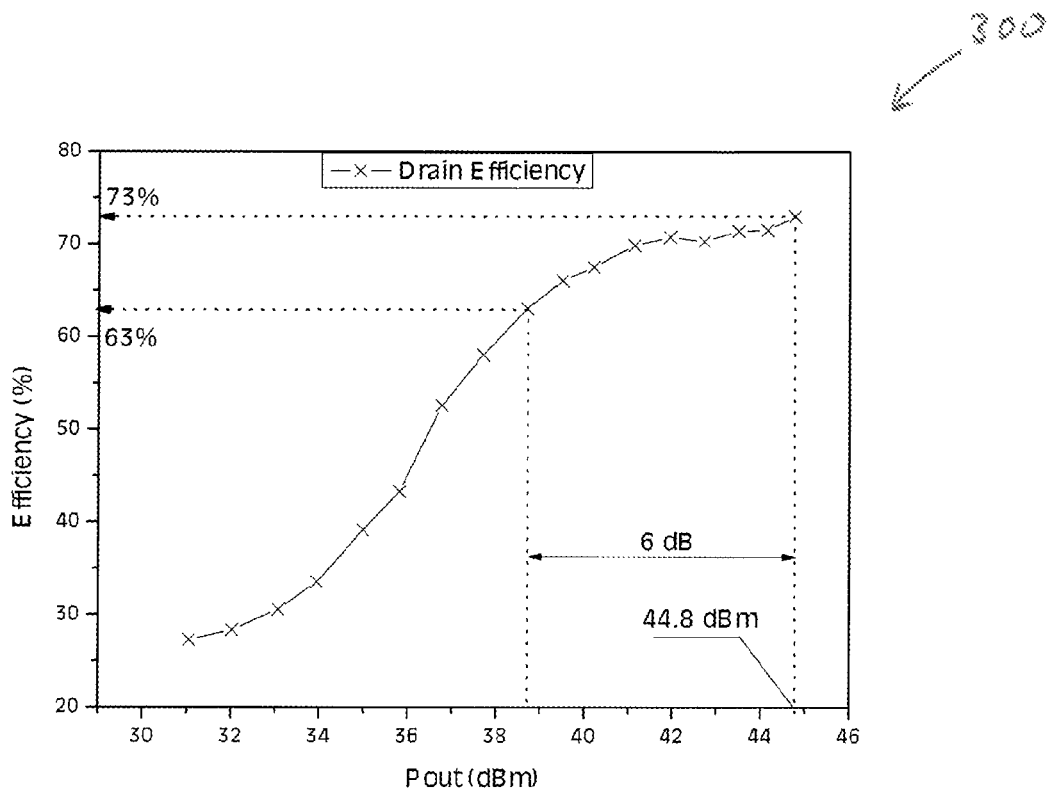
FIG. 3 is a graph showing the relationship between the total output power and the measured drain efficiency of the power amplifier of FIG. 1 under a single-tone continuous wave excitation.

FIG. 3 is a graph 300 showing the measured drain efficiency versus the total output power for the power amplifier 100 of FIG. 1 under a single-tone continuous wave excitation. As shown in the graph, the drain efficiency is 63% at the 6-dB back-off point and the peak power is 73%. Also, efficiency greater than 40% is achieved in a 10-dB power range from saturation.

Figure 4:
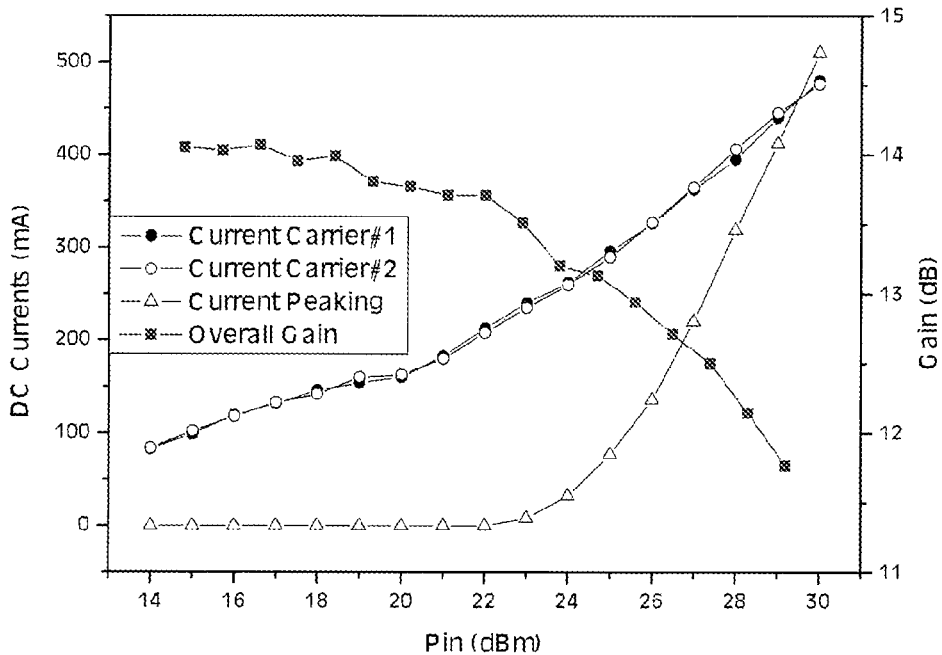
FIG. 4 is a graph showing the relationship between the DC currents of the sub-amplifiers and the input power of the power amplifier of FIG. 1.

FIG. 4 is a graph 400 showing the DC currents of the sub-amplifiers (carrier and peaking) against input power for the power amplifier 100 of FIG. 1. As shown in the graph, the current curves for the carrier power amplifiers 110 are very close to each other. This indicates an accepted conformity between these carrier power amplifiers 110.

The power amplifier 100 in this embodiment is particularly advantageous in that it can be used directly to drive differential components without using baluns. Moreover, the power amplifier 100 in this embodiment is compact as the number of transistors and affiliated circuitries required are reduced when compared with using two Doherty power amplifiers. In this embodiment, the power fed to the peaking power amplifier 112 is twice as large as that fed to the two carrier power amplifiers 110. Essentially, only half of the input power is wasted when the peaking power amplifier 112 is off. This may help to relieve the gain degradation if a larger sized peaking power amplifier is adopted with more input power feeding in order to balance the currents.

Figure 5:
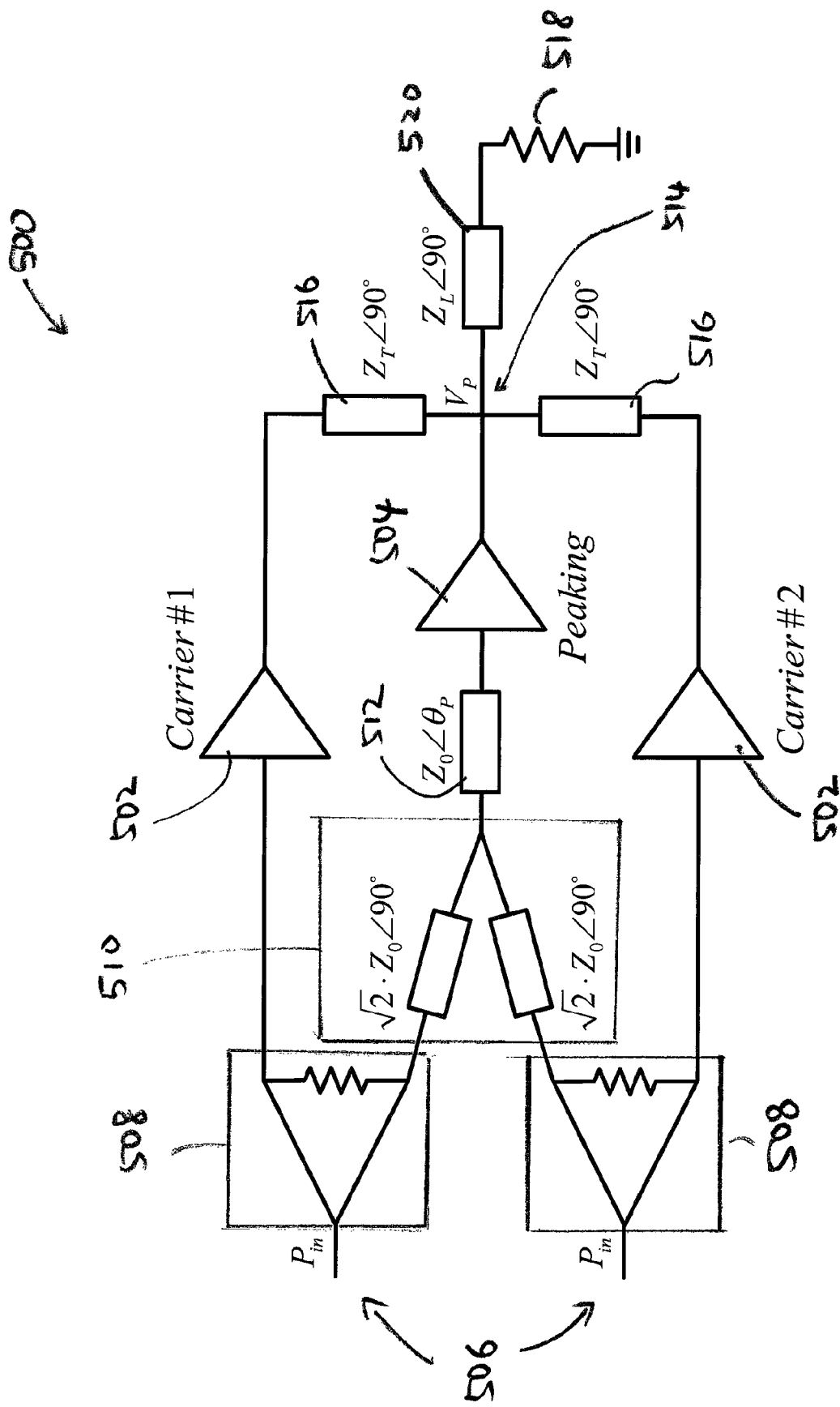
FIG. 5 shows a power amplifier with a second embodiment of the present invention.

FIG. 5 shows a power amplifier 500 in a second embodiment of the present invention. In particular, the power amplifier 500 in this embodiment amplifies an in-phase input and provides a combined single-ended output. As shown in FIG. 5, the structure of the power amplifier 500 in this embodiment is similar to that in the first embodiment in which two carrier power amplifiers 502 and a peaking power amplifier 504 arranged in parallel branches are used. Also, these amplifiers are preferably optimized independently before assembly. As shown in FIG. 5, the power amplifier 500 has two inputs 506 arranged to receive in-phase input power signals. The in-phase input signals are split and distributed into three paths by two Wilkinson dividers 508 and a T-junction combiner 510. In other embodiments, other signal dividing and combining components may be used. Similar to the power amplifier 100 in the first embodiment, in this case, a section of transmission line 512 with impedance $Z_0$ is inserted before the peaking power amplifier 504 to balance the phase of the signal delivered to the peaking power amplifier 504. Alternatively, different phase balancing means may be used. In yet some other embodiments, transmission lines or other phase adjustment means may be placed before the carrier power amplifiers 502 so as to control the phase of the signal delivered to the carrier power amplifiers 502. In this embodiment, $Z_o$ is also a reference impedance of the power amplifier 500.

In this embodiment, when the input power is low, the carrier power amplifiers 502 are used for power amplification whereas the peaking power amplifier 504 is inactive. When the input is at high power, all three amplifiers are operated to provide output power signals. The output power signals from the two carrier power amplifiers 502 are combined in-phase at the output terminal 514 when the input power is low. On the other hand, the output power signals from all three amplifiers are combined in-phase at the output terminal 514 when the input power is high.

Preferably, an impedance transformer 516 with impedance $Z_T$ is preferably disposed at the output of each of the carrier power amplifier 502 so as to modulate load impedance at different power levels of the carrier power amplifiers 502 prior to combining with other output power signals at the output terminal 514. In the embodiment shown in FIG. 5, the impedance transformers 516 are quarter-wavelength transmission lines. In this embodiment, the combined output power signal distributed to the load 518 is further adjusted by a quarter-wavelength transmission line 520 with impedance $Z_T'$.

Figure 6A:
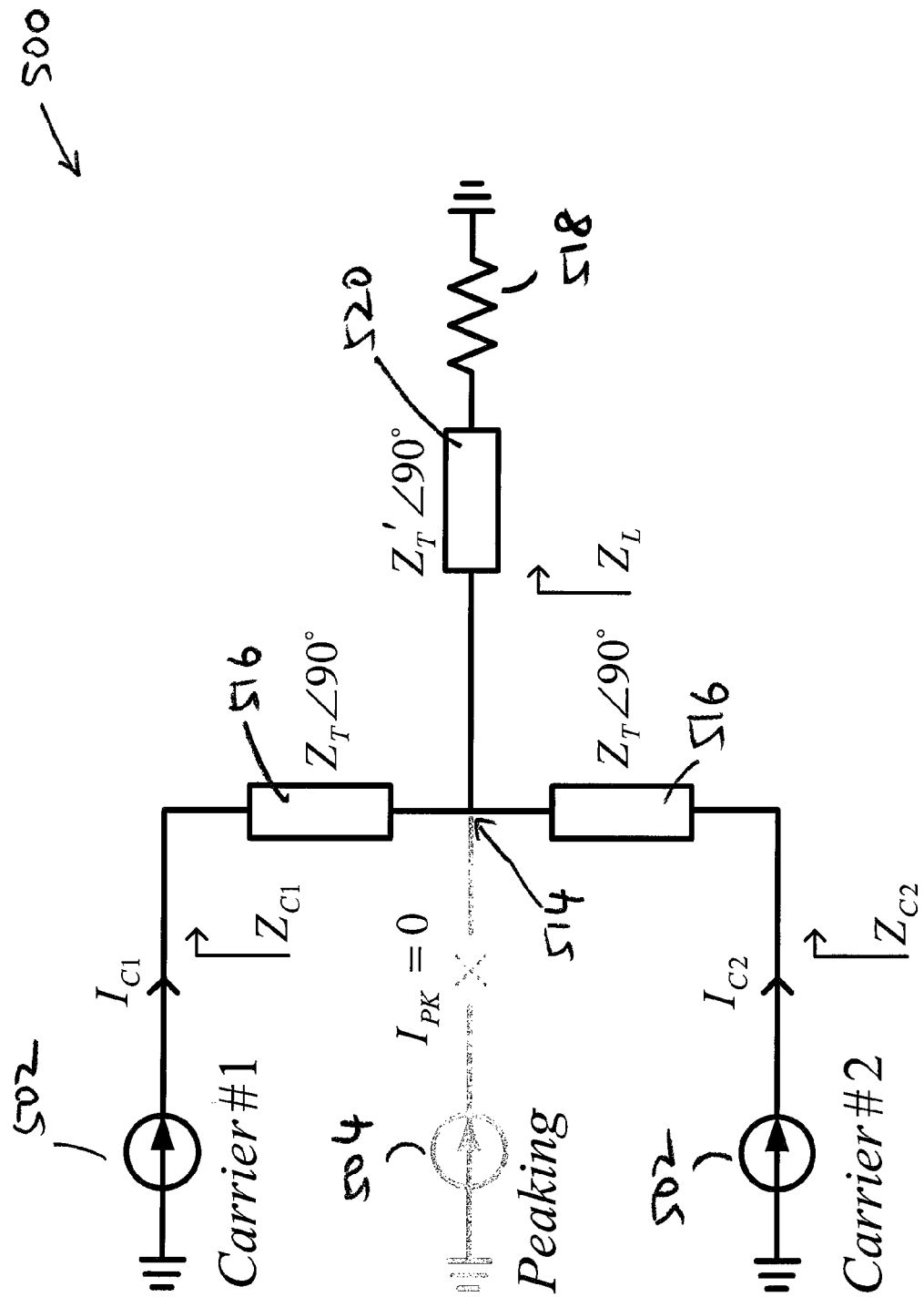
FIG. 6A shows an equivalent circuit of the power amplifier of FIG. 5 operating in a low-power region (lower input power)
Figure 6B:
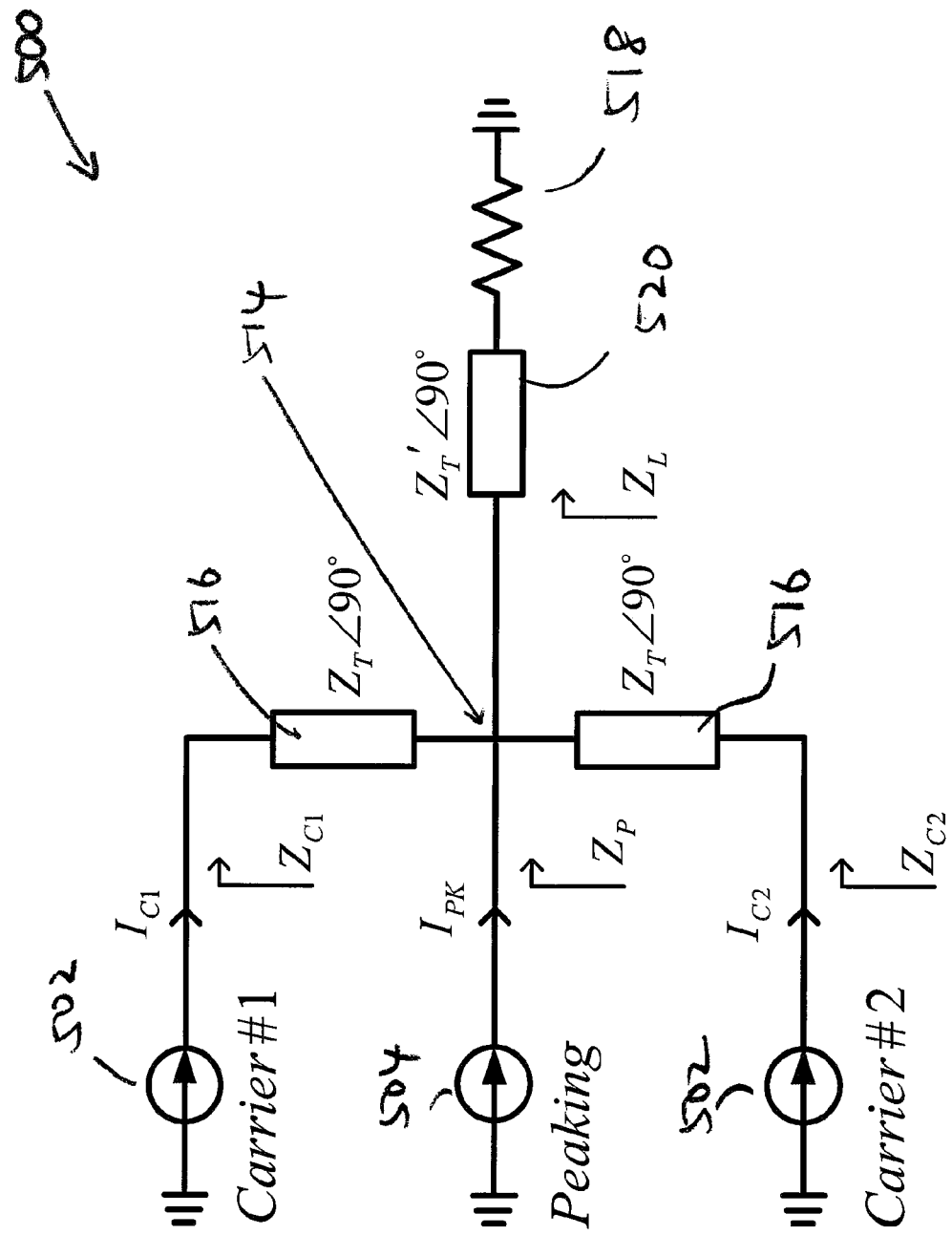
FIG. 6B shows an equivalent circuit of the power amplifier of FIG. 5 operating in a high-power region (high input power)

Referring now to FIGS. 6A and 6B, there is shown an equivalent circuit of the power amplifier 500 of FIG. 5 operating in a low-power region and the high-power region respectively. As shown in FIG. 6A, in the lower power region, the peaking power amplifier 504 is in an off-state and the carrier power amplifiers 502 operate to drive the same load 518 symmetrically. For the low-power operation, the load impedance for each of the carrier power amplifier 502 is $$Z_{C1,low} = Z_{C2,low} = \frac{Z_T^2}{2 \cdot Z_L} = \frac{Z_T^2}{2 \cdot (Z_T')^2} \cdot Z_0 \qquad (10)$$

As the input increases, the peaking power amplifier 504 starts to operate.

As shown in FIG. 6B, for high power operation, the active load modulation is realized by the participation of the peaking power amplifier 504. Assuming $$I_{C1} = I_{C2} = I_C \angle 90°$$

$$I_{PK} = I_P \angle 0° \qquad (11)$$

where $I_{C1}$, $I_{C2}$ are currents from the two carrier power amplifiers 502 and $I_{PK}$ is current from the peaking power amplifier 504 respectively. The load impedance to the carrier power amplifiers 502 and the peaking power amplifier 504 at saturation are given as $$Z_{C1,sat} = Z_{C2,sat} = \frac{Z_T^2}{2 \cdot Z_L}\left(1 - \delta \cdot \frac{Z_L}{Z_T}\right) \qquad (12)$$

$$Z_{P,sat} = \frac{Z_T}{\delta}$$

based on S. Chen and Q. Xue, "Optimized Load Modulation Network for Doherty Power Amplifier Performance Enhancement," IEEE Trans. Microw. Theory Tech., vol. 60, no. 11, pp. 3474-3481, November 2012.

In equation (12), $\delta = I_{P,sat}/I_{C,sat}$ is again defined as the fundamental current ratio at saturation. By setting $Z_{C1,sat} = Z_{C2,sat} = Z_{P,sat} = Z_0$ in order to facilitate independent optimization of each sub-amplifiers (carrier and peaking) and further assembly, the characteristic impedances of $Z_T$ and $Z_T'$ can be expressed as $$Z_T = \delta \cdot Z_0 \qquad (5)$$

$$Z_T' = \frac{\delta}{\sqrt{2 + \delta^2}} \cdot Z_0$$

Furthermore, by substituting equation (13) into equation (10), it is found that the load impedance in the low-power region for the carrier power amplifiers 502 is $(2+\delta^2)/2 \cdot Z_0$, which reduces gradually to $Z_0$ as the input power increases.

In this embodiment, preferably, output matching networks and offset lines (not shown) are provided to associate with the carrier power amplifiers 502 such that the two transistors are optimally matched to a load impedance during operation in the low-power region. Preferably, the peaking amplifier also has an output matching network and an associated offset line (not shown) for impedance matching and reverse power leakage prevention.

It should be noted that the low-power impedance of the power amplifier 500 in this embodiment is similar to that of the power amplifier 100 of the first embodiment. As a result, similar drain efficiencies at 6-dB back-off points are achieved for the power amplifier in both embodiments. The total drain efficiency and gain for the power amplifier 500 in this embodiment are expressed as $$\eta_t = \frac{P_{out}}{P_{dc}^{c1} + P_{dc}^{c2} + P_{dc}^{p}} \quad (14)$$

$$Gain_t = P_{out} - 2P_{in}$$

where $\eta_t$ and $Gain_t$ are the total drain efficiency and total gain and $P_{out}$, $P_{dc}^{c1}$, $P_{dc}^{c2}$ and $P_{dc}^{p}$ refer to the output power at the load 518 and the DC consumptions for the carrier power amplifiers 502 and the peaking power amplifier 504. $P_{in}$ refers to the input power as shown in FIG. 5.

Figure 7:
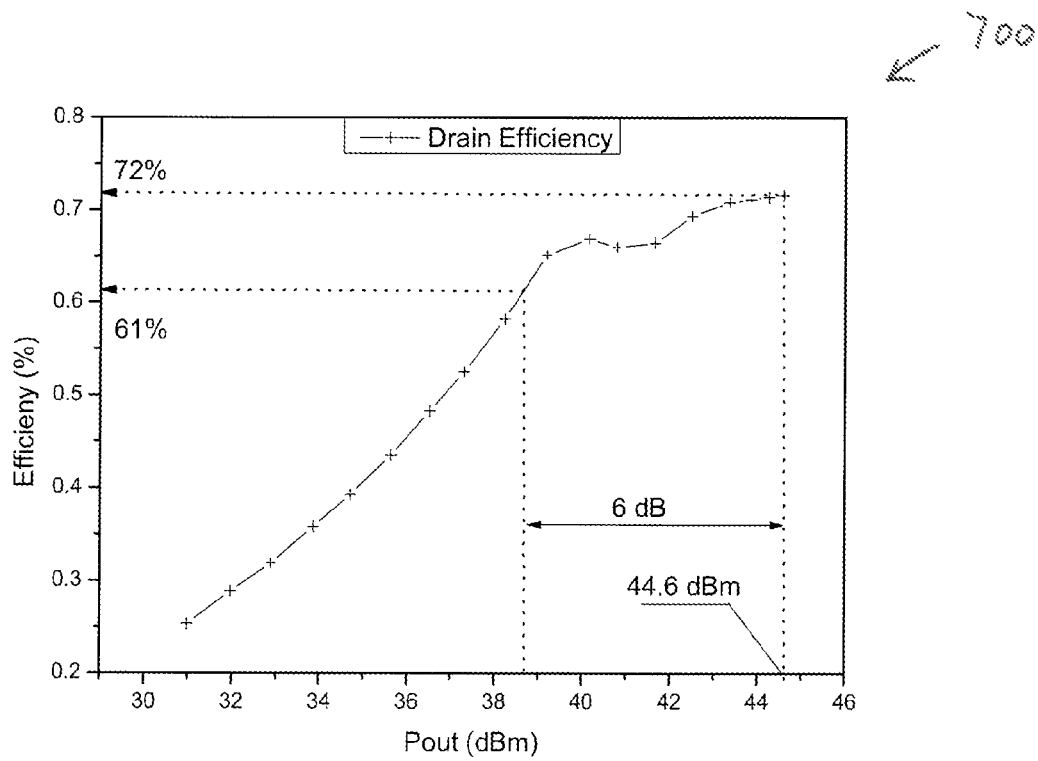
FIG. 7 is a graph showing the relationship between the total output power and the measured drain efficiency of the power amplifier of FIG. 5 under a single-tone continuous wave excitation.

FIG. 7 is a graph 700 showing the measured drain efficiency versus total output power for the power amplifier 500 of FIG. 5 under a single-tone continuous wave excitation. As shown in the graph, the drain efficiency is 61% at the 6-dB back-off point and the peak power is 72%. Also, efficiency greater than 40% is achieved in an approximate 10-dB power range from the saturation power of 44.6 dBm.

Figure 8:
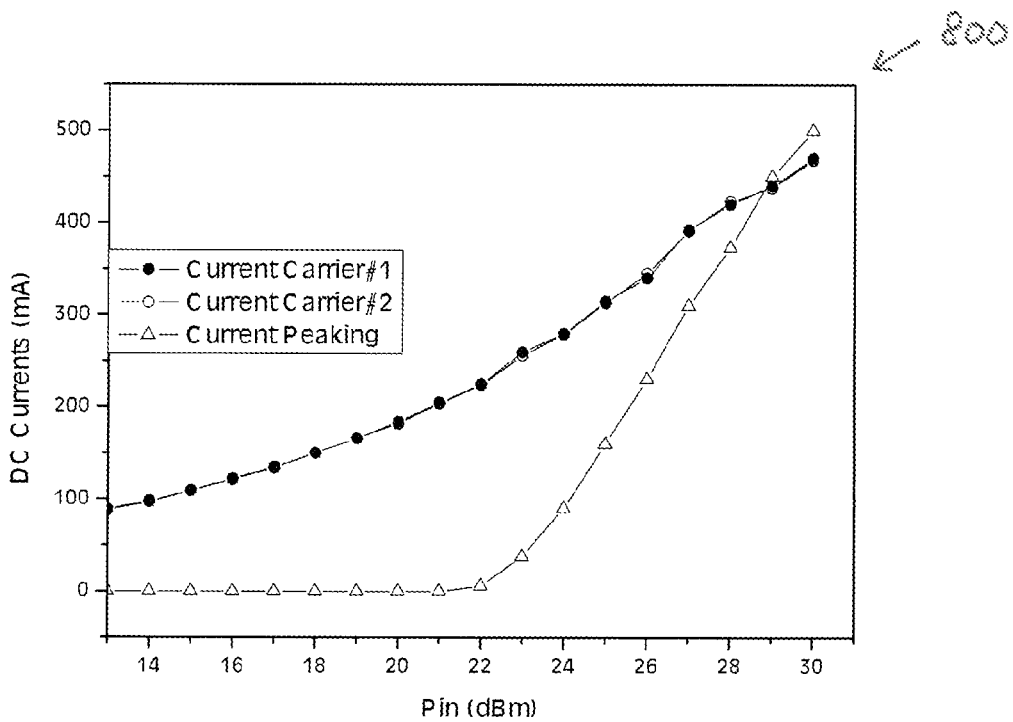
FIG. 8 is a graph showing the relationship between the DC currents of the sub-amplifiers and the input power of the power amplifier of FIG. 5.

FIG. 8 is a graph 800 showing the DC currents of the sub-amplifiers (carrier and peaking) against input power for the power amplifier 500 of FIG. 5. As seen from the graph, the current swings obtained for the power amplifier 500 of FIG. 5 is similar to that for the power amplifier 100 of FIG. 1 shown in FIG. 4. This confirms that the load conditions are similar in the power amplifier in both configurations.

In this embodiment, the three amplifier outputs are combined in-phase at the output terminal 516. The power amplifier 500 in this embodiment is particularly advantageous in that the amplification and power combining functions are well integrated in a compact and effective manner. This allows the size of the circuit to be reduced and hence minimizes production costs and enhances effectiveness.

In summary, the proposed power amplifier in different embodiments described above utilizes a very compact but cost-effective structure to realize fully differential or power-combining Doherty power amplifiers. By using the twin-carrier and single-peaking configuration, the size of the amplifier circuit is greatly reduced and implementation cost is minimized. Moreover, in the proposed power amplifier, the overall gain can be achieved without wasting too much power in the peaking power amplifier. In some applications, the proposed power amplifier can be integrated into differential and power-combining circuit respectively.

Although a single-peaking twin-carrier configuration is illustrated in above embodiments, it can be readily appreciated by persons skilled in the art that single-carrier twin-peaking architecture can also be used. Similar to the detailed description above, in the single-carrier twin-peaking case, only the carrier power amplifier is operative at low power whereas all of the carrier power amplifier and the peaking power amplifiers are operative at high power. The system architecture and the junction arrangement are also similar, except for values of the impedances $Z_T$ and $Z_T'$.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A power amplifier comprising:
   a plurality of primary amplifying channels arranged to each receive an input signal from one or more signal sources for generating a primary amplified output in each of the plurality of primary amplifying channels;
   a secondary amplifying channel in communication with the one or more signal sources wherein the secondary amplifying channel is arranged to receive one or more signal components each associated with the input signal received by each of the plurality of primary amplifying channels to form a merged input signal for generating a secondary amplified output; and
   an electric junction arrangement being in electrical communication with the primary amplified output of each of the primary amplifying channels and the secondary amplified output of the secondary amplifying channel;
   wherein signals from the signal sources are each divided by a distribution component to form the input signal in one of the plurality of primary amplifying channels and the signal component received by the secondary amplifying channel;
   wherein each of the primary amplifying channels comprises:
      a carrier amplifier arranged to generate the primary amplified output in response to the input signal; and
      a transformer component having an impedance $Z_T$ arranged to modulate a load impedance at different power levels; and
      each of the carrier amplifiers are further associated with an output matching network and offset lines arranged to match the load impedance; and
   wherein the secondary amplifying channel comprises:
      a phase adjustment component having an impedance $Z_o$ arranged to adjust a phase of the merged input signal; and
      a peaking amplifier arranged to generate the secondary amplified output in response to the merged input signal;
   wherein only the carrier amplifiers are operative when the signals from the signal sources are of low power;
   wherein the peaking and carrier amplifiers are operative when the signals from the signal sources are of high power;
   wherein the one or more signal components received by the secondary amplifying channel are merged by a 180° hybrid coupler arranged to form the merged input signal.

2. The power amplifier in accordance with claim 1, wherein the electric junction arrangement includes a junction component arranged to isolate the plurality of primary amplifying channels from each other when the signals from the signal sources are of low power such that the plurality of primary amplified outputs are each distributed to a load.

3. The power amplifier in accordance with claim 2, wherein the junction component has a 180° phase difference.

4. The power amplifier in accordance with claim 1, wherein the electric junction arrangement includes a junction component arranged to distribute the secondary amplified output into the plurality of primary amplifying channels and to combine a portion of the distributed secondary amplified output with the primary amplified output in each of the plurality of primary amplifying channels such that the plurality of combined outputs are each distributed to a load.

5. The power amplifier in accordance with claim 1, further comprising a plurality of output transformers each having an impedance $Z_T'$ arranged to match the impedance $Z_o$.

6. A power amplifier comprising:
a plurality of primary amplifying channels arranged to each receive an input signal from one or more signal sources for generating a primary amplified output in each of the plurality of primary amplifying channels;
a secondary amplifying channel in communication with the one or more signal sources wherein the secondary amplifying channel is arranged to receive one or more signal components each associated with the input signal received by each of the plurality of primary amplifying channels to form a merged input signal for generating a secondary amplified output; and
an electric junction arrangement being in electrical communication with the primary amplified output of each of the primary amplifying channels and the secondary amplified output of the secondary amplifying channel;
wherein signals from the signal sources are each divided by a distribution component to form the input signal in one of the plurality of primary amplifying channels and the signal component received by the secondary amplifying channel;
wherein each of the primary amplifying channels comprises:
a carrier amplifier arranged to generate the primary amplified output in response to the input signal; and
a transformer component having an impedance $Z_T$ arranged to modulate a load impedance at different power levels; and
each of the carrier amplifiers are further associated with an output matching network and offset lines arranged to match the load impedance; and
wherein the secondary amplifying channel comprises:
a phase adjustment component having an impedance $Z_o$ arranged to adjust a phase of the merged input signal; and
a peaking amplifier arranged to generate the secondary amplified output in response to the merged input signal;
wherein only the carrier amplifiers are operative when the signals from the signal sources are of low power;
wherein the peaking and carrier amplifiers are operative when the signals from the signal sources are of high power; wherein the one or more signal components received by the secondary amplifying channel are merged by a T-junction combiner arranged to provide a combined signal to form the merged input signal.

7. The power amplifier in accordance with claim 6, wherein the electric junction arrangement includes a junction node arranged to receive all the primary amplified outputs and the secondary amplified output to form a combined output such that the combined output is distributed to a load.

8. The power amplifier in accordance with claim 7, further comprising an output transformer having an impedance $Z_T'$ arranged to adjust the combined output distributed to the load and match the impedance $Z_o$.

9. The power amplifier of claim 8, wherein $Z_T$ and $Z_T'$ are related to $Z_o$ by $$Z_T' = \frac{\delta}{\sqrt{2+\delta^2}} \cdot Z_0$$

and $$Z_T = \delta \cdot Z_0$$

respectively where $\delta$ is a saturation current ratio of the peaking amplifier to that of the carrier amplifier;
$Z_o$ is the impedance of the phase adjustment component;
$Z_T$ is the impedance of the transformer component; and
$Z_T'$ is the impedance of the output transformer.

10. The power amplifier in accordance with claim 6, wherein the signals from the signal source are equal in magnitude and in-phase.

11. A power amplifier comprising:
a plurality of primary amplifying channels arranged to each receive an input signal from one or more signal sources for generating a primary amplified output in each of the plurality of primary amplifying channels;
a secondary amplifying channel in communication with the one or more signal sources wherein the secondary amplifying channel is arranged to receive one or more signal components each associated with the input signal received by each of the plurality of primary amplifying channels to form a merged input signal for generating a secondary amplified output; and
an electric junction arrangement being in electrical communication with the primary amplified output of each of the primary amplifying channels and the secondary amplified output of the secondary amplifying channel;
wherein signals from the signal sources are each divided by a distribution component to form the input signal in one of the plurality of primary amplifying channels and the signal component received by the secondary amplifying channel;
wherein each of the primary amplifying channels comprises:
a carrier amplifier arranged to generate the primary amplified output in response to the input signal; and
a transformer component having an impedance $Z_T$ arranged to modulate a load impedance at different power levels; and
each of the carrier amplifiers are further associated with an output matching network and offset lines arranged to match the load impedance; and
wherein the secondary amplifying channel comprises:
a phase adjustment component having an impedance $Z_o$ arranged to adjust a phase of the merged input signal; and
a peaking amplifier arranged to generate the secondary amplified output in response to the merged input signal;
wherein the peaking amplifier is associated with an output matching network and offset line for impedance matching and reverse power leakage prevention;
wherein only the carrier amplifiers are operative when the signals from the signal sources are of low power;
wherein the peaking and carrier amplifiers are operative when the signals from the signal sources are of high power.

* * * * *